United States Patent
Mathijssen et al.

(10) Patent No.: US 9,857,703 B2
(45) Date of Patent: Jan. 2, 2018

(54) ALIGNMENT SENSOR AND LITHOGRAPHIC APPARATUS

(71) Applicants: ASML Netherlands B.V., Veldhoven (NL); ASML Holding N.V., Veldhoven (NL)

(72) Inventors: Simon Gijsbert Josephus Mathijssen, Den Bosch (NL); Arie Jeffrey Den Boef, Waalre (NL); Justin Lloyd Kreuzer, Trumbull, CT (US); Patricius Aloysius Jacobus Tinnemans, Hapert (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 0 days.

(21) Appl. No.: 15/328,194

(22) PCT Filed: Jul. 7, 2015

(86) PCT No.: PCT/EP2015/065412
§ 371 (c)(1),
(2) Date: Jan. 23, 2017

(87) PCT Pub. No.: WO2016/015955
PCT Pub. Date: Feb. 4, 2016

(65) Prior Publication Data
US 2017/0212434 A1    Jul. 27, 2017

Related U.S. Application Data

(60) Provisional application No. 62/030,639, filed on Jul. 30, 2014.

(51) Int. Cl.
G03B 27/54    (2006.01)
G03F 9/00    (2006.01)

(52) U.S. Cl.
CPC .......... *G03F 9/7088* (2013.01); *G03F 9/7065* (2013.01); *G03F 9/7069* (2013.01)

(58) Field of Classification Search
CPC .... G03F 9/7065; G03F 9/7069; G03F 9/7088; G03F 7/70575
(Continued)

(56) References Cited

U.S. PATENT DOCUMENTS

2005/0110965 A1    5/2005    Hendriks et al.
2006/0270057 A1    11/2006    Sharma
(Continued)

FOREIGN PATENT DOCUMENTS

TW    201344737 A    11/2013
TW    201423286 A    6/2014
(Continued)

OTHER PUBLICATIONS

International Search Report directed to related International Patent Application No. PCT/EP2015/065412, dated Dec. 15, 2015; 3 pages.
(Continued)

*Primary Examiner* — Peter B Kim
(74) *Attorney, Agent, or Firm* — Sterne, Kessler, Goldstein & Fox P.L.L.C.

(57) ABSTRACT

An alignment sensor for a lithographic apparatus is arranged and constructed to measure an alignment of a movable part of the lithographic apparatus in respect of a stationary part of the lithographic apparatus. The alignment sensor comprises a light source configured to generate a pulse train at a optical wavelength and a pulse repetition frequency, a non-linear optical element, arranged in an optical propagation path of the pulse train, the non-linear optical element configured to transform the pulse train at the optical wavelength into a transformed pulse train in an optical wave-
(Continued)

length range, an optical imaging system configured to project the transformed pulse train onto an alignment mark comprising a diffraction grating; a detector to detect a diffraction pattern as diffracted by the diffraction grating, and a data processing device configured to derive alignment data from the detected diffraction pattern as detected by the detector.

12 Claims, 5 Drawing Sheets

(58) Field of Classification Search
    USPC .......................................................... 355/67
    See application file for complete search history.

(56) References Cited

U.S. PATENT DOCUMENTS

| | | |
|---|---|---|
| 2011/0090476 A1 | 4/2011 | Van De Kerkhof et al. |
| 2013/0050674 A1* | 2/2013 | Prosyentsov ......... G03F 9/7015 355/72 |
| 2015/0109601 A1 | 4/2015 | Scheffers et al. |
| 2015/0177625 A1 | 6/2015 | De Boer et al. |
| 2015/0227061 A1 | 8/2015 | Tinnemans et al. |

FOREIGN PATENT DOCUMENTS

| | | |
|---|---|---|
| TW | 201426208 A | 7/2014 |
| WO | WO 2014/056708 A2 | 4/2014 |
| WO | WO 2015/051970 A1 | 4/2015 |

OTHER PUBLICATIONS

International Preliminary Report on Patentability and Written Opinion of the International Searching Authority directed to related International Patent Application No. PCT/EP2015/065412, dated Jan. 31, 2017; 6 pages.

* cited by examiner

ALIGNMENT SENSOR AND LITHOGRAPHIC APPARATUS

CROSS-REFERENCE TO RELATED APPLICATIONS

This application claims the benefit of U.S. provisional application 62/030,639, which was filed on Jul. 30, 2014 and which is incorporated herein in its entirety by reference.

BACKGROUND

Field of the Invention

The present invention relates to an alignment sensor and to a lithographic apparatus comprising such alignment sensor.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In lithography, when manufacturing semiconductor structures, many layers are provided on top of each other. In order to reduce overlay errors, the layers are to be aligned in respect of each other accurately, so as to be able to achieve small line widths.

Thereto, use is made of an alignment sensor. Alignment marks are provided onto the substrate in one or more of the processed layers. Each time the substrate is loaded into the lithographic apparatus, the alignment marks are measured and a position of the substrate is derived therefrom. Thereto, the alignment sensor projects optical pulses onto the alignment mark in order to be scattered by that mark. An intensity of the scattered field is after optical processing, e.g., after optical processing via an interferometer, measured by a detector, and position information (expressing the position of the mark in respect of the detector) is derived therefrom. An alignment mark may comprise, for example, a diffraction grating or a non-diffracting structure. Light that is scattered by the diffraction grating is a scattered field typically referred to as diffracted light.

As substrate structures tend to get increasingly complex, a total number of layers to be provided on the substrate tends to increase. As a result, the mark that is to be used for the alignment, may be covered with several layers provided on top of it. Depending on a structure of the layers, optical transmission of certain optical wavelengths may be affected. As a result, light pulses at such wavelengths may be adsorbed, reflected or otherwise affected by these layers. In order to increase a chance of reliably detecting the mark, use is made of multiple wavelength optical pulses.

SUMMARY

It is desirable to provide a more accurate alignment measurement.

According to an embodiment of the invention, there is provided an alignment sensor for a lithographic apparatus, the alignment sensor being arranged and constructed to measure an alignment of a movable part at the lithographic apparatus in respect of a stationary part of the lithographic apparatus, the alignment sensor comprising
  a light source configured for generating a pulse train at a optical wavelength and a pulse repetition frequency,
  a non-linear optical element, arranged in an optical propagation path of the pulse train, the non-linear optical element being configured for transforming the pulse train at the optical wavelength into a transformed pulse train in an optical wavelength range,
  an optical imaging system configured to project the transformed pulse train onto an alignment mark;
  a detector to detect a scattered pattern resulting from scattering at the alignment mark, and
  a data processing device configured to derive alignment data from the detected scattered pattern as detected by the detector,
  wherein the optical imaging system comprises a pulse delay generator,
  the pulse delay generator comprising:
  a splitter configured to split the pulse train into a first polarized pulse train at a first polarization and a second polarized pulse train at a second polarization different from the first polarization,
  a recombiner configured to combine the first polarized pulse train and the second polarized pulse train into a combined pulse train,
  wherein a propagation path length of a propagation path of the first polarized pulse train differs from a propagation path length of a propagation path of the second polarized pulse train so as to delay one of the first and second polarized pulse trains in respect of the other one of the polarized pulse trains,
  the optical imaging system being configured to project the combined pulse train onto the alignment mark.

In another embodiment of the invention, there is provided a lithographic apparatus comprising such alignment sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present invention may be implemented.

Example Reflective and Transmissive Lithographic Systems

Figure 1A:
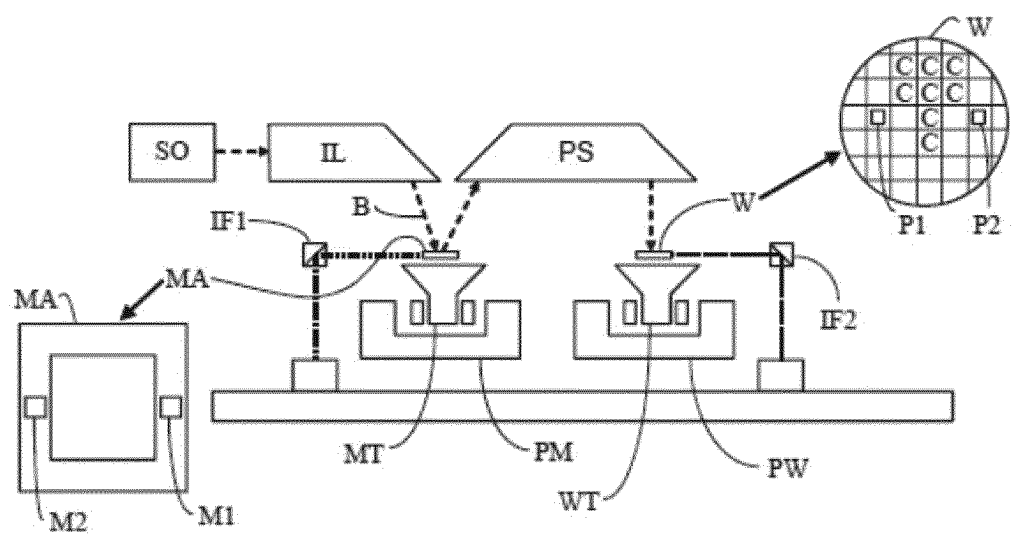
FIG. 1A is a schematic illustration of a reflective lithographic apparatus in which an embodiment of the invention may be provided.
Figure 1B:
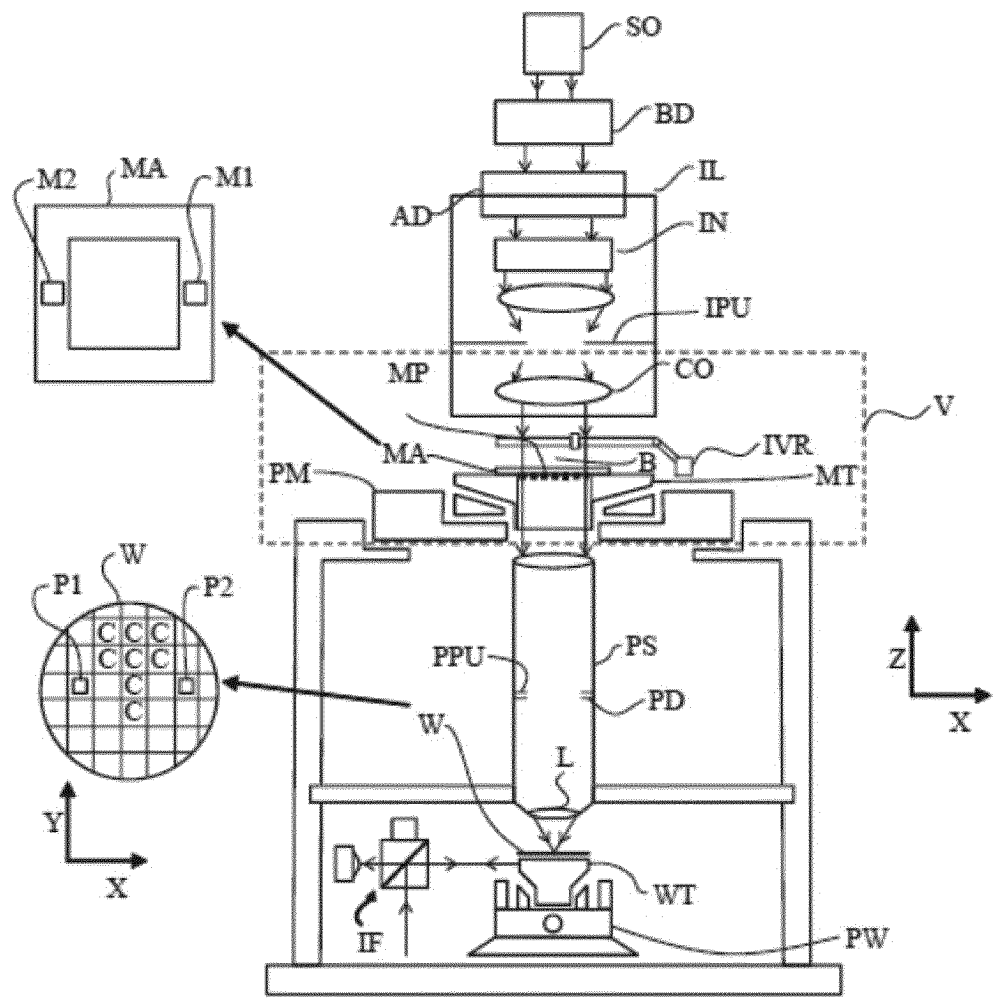
FIG. 1B is a schematic illustration of a transmissive lithographic apparatus in which an embodiment of the invention may be provided.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, DUV or EUV radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, magnetic, electromagnetic, electrostatic, or other types of optical components, or any combination thereof, for directing, shaping, or controlling the radiation B.

The support structure MT holds the patterning device MA in a manner that depends on the orientation of the patterning device MA, the design of the lithographic apparatuses 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. The support structure MT can ensure that the patterning device is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by the mirror matrix.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables (and/or two or more mask tables) WT. In such "multiple stage" machines, the additional substrate tables WT can be used in parallel, or preparatory steps can be carried out on one or more tables while one or more other substrate tables WT are being used for exposure.

The lithographic apparatus (in particular the transmissive type as described with reference to FIG. 1B) may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIGS. 1A and 1B, the illuminator IL receives a radiation beam from a radiation source SO. The source SO and the lithographic apparatuses 100, 100' can be separate entities, for example, when the source SO is an excimer laser. In such cases, the source SO is not considered to form part of the lithographic apparatuses 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatuses 100, 100'—for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system PS has a pupil PPU conjugate to an illumination system pupil IPU. Portions of radiation emanate from the intensity distribution at the illumination system pupil IPU and traverse a mask pattern without being affected by diffraction at a mask pattern create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatuses 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to herein.

Combinations and/or variations on the described modes of use or entirely different modes of use can also be employed.

Although specific reference can be made in this text to the use of lithographic apparatus in the manufacture of ICs, it should be understood that the lithographic apparatus described herein can have other applications, such as the manufacture of integrated optical systems, guidance and detection patterns for magnetic domain memories, flat-panel displays, liquid-crystal displays (LCDs), and thin-film magnetic heads. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (a tool that typically applies a layer of resist to a substrate and develops the exposed resist), a metrology tool, and/or an inspection tool. Where applicable, the disclosure herein can be applied to such and other substrate processing tools. Further, the substrate can be processed more than once, for example, in order to create a multi-layer IC, so that the term substrate used herein can also refer to a substrate that already contains one or multiple processed layers.

In a further embodiment, lithographic apparatus 100 includes an extreme ultraviolet (EUV) source, which is configured to generate a beam of EUV radiation for EUV lithography. In general, the EUV source is configured in a radiation system (see below), and a corresponding illumination system is configured to condition the EUV radiation beam of the EUV source.

In the embodiments described herein, the terms "lens" and "lens element," where the context allows, can refer to any one or combination of various types of optical components, including refractive, reflective, magnetic, electromagnetic, and electrostatic optical components.

Further, the terms "radiation" and "beam" used herein encompass all types of electromagnetic radiation, including visible radiation (for example, having a wavelength λ in the range of 400 to 780 nm), ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by air), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

An embodiment of an alignment sensor is described in detail in U.S. Provisional Patent Application, Appl. No. 61/888,803; Filing Date: Oct. 9, 2013, and in published under PCT as WO 2015/051970, the contents of both documents being incorporated herein in its entirety by reference.

Generally, an alignment mark, such as a diffraction grating or another type of alignment mark, is provided on the substrate. The alignment sensor projects optical pulses onto the alignment mark in order to be scattered by the alignment mark. An intensity of the scattered optical pulses is measured by a detector, and position information (expressing the position of the alignment mark in respect of for example the alignment sensor) is derived therefrom.

A plurality of wavelengths may be applied. Thereto, the optical pulses are provided to a non-linear optical element that transforms the narrow band pulses into pulses at a wider spectrum, such as pulses at a plurality of distinct wavelengths or pulses in an optical wavelength band. Separate detectors may be provided for the different wavelengths or different wavelength bands, in order to detect the scattered patterns, e.g., diffraction patterns in case of using an alignment mark with a diffraction grating, at the different wavelengths. Substrate structures tend to get increasingly complex and a total number of layers to be provided on the substrate tend to increase. As a result, the alignment mark that is to be used for the alignment, may be covered with several layers provided on top of it. Depending on a structure of the layers, optical transmission of certain optical wavelengths may be affected. Optical pulses at some of the wavelengths may be adsorbed, reflected or otherwise affected by these layers. When applying multiple wavelengths, a detection of the alignment mark may be performed making use of the remaining wavelengths.

The non-linear optical element may form a source of noise, as a conversion of the incident pulses into the pulses at different wavelengths may exhibit a per-pulse fluctuation. This source of noise may translate into an inaccuracy in the measurement results of the alignment sensor.

Figure 2:
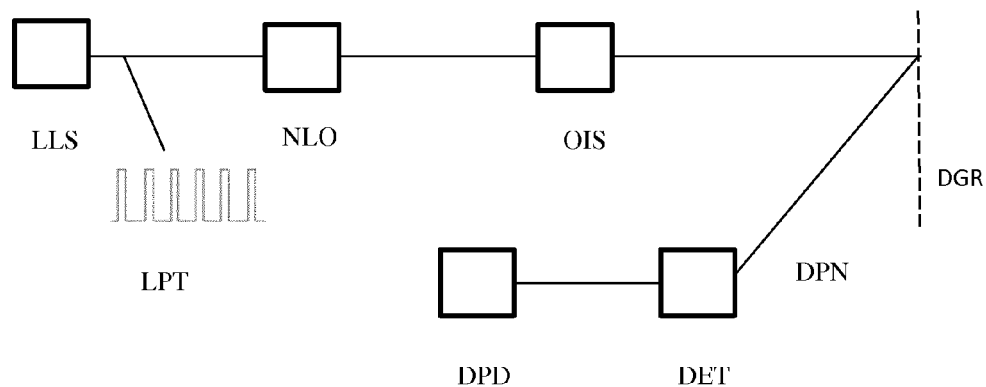
FIG. 2 depicts a schematic view of an alignment sensor in which an embodiment of the invention may be practiced.

FIG. 2 depicts a schematic view of a light source LLS that generates a pulse train LPT. The light source may be a pulsed, which emits in for example the visible spectrum, near ultraviolet (UV) spectrum or the near infrared (IR) spectrum. The pulse train LPT may have any suitable pulse repetition frequency. In a practical implementation, a repetition frequency in a range of for example 10 MHz to 1 GHz may be applied, for example a pulse repetition frequency of approximately 80 MHz. The pulse train is provided to a non-linear optical element NLO, such as a photonic crystal fiber. Due to its non-linear optical characteristics, the non-linear optical element transforms the (e.g., monochromatic) pulses into pulses comprising at least two wavelengths in a wavelength range. For example the non-linear optical element may transform the (e.g., monochromatic) pulses in the pulse train into pulses over an optical spectrum, e.g., a visible wavelength band. An imaging system OIS, such as a lens system, projects the pulses as transformed by the non-linear optical element, onto the substrate, in particular onto a zone of the substrate in which an alignment mark is expected to be detected. Upon incidence of the pulse train LPT as transformed by the non-linear optical element and as projected by the optical imaging system, onto the alignment mark DGR, a scattered field DPN will be generated. In case the alignment mark comprises a diffraction grating, the scattered field may comprise e.g., one or more of: a first order and minus first order diffraction beam, a second order and minus second order diffraction beam. A detector DET (comprising e.g., a photodiode) detects the scattered pattern and generates a detector output signal in response thereto. A data processing device DPD (comprising e.g., a microprocessor programmed by suitable software instructions and/or dedicated data processing hardware) receives the detector output signal of the detector and derives position information therefrom, for example from phase information in the detector signal. The position information expressing a position of the alignment mark in respect of the alignment sensor may be derived from the detected scattered pattern.

Figure 3:
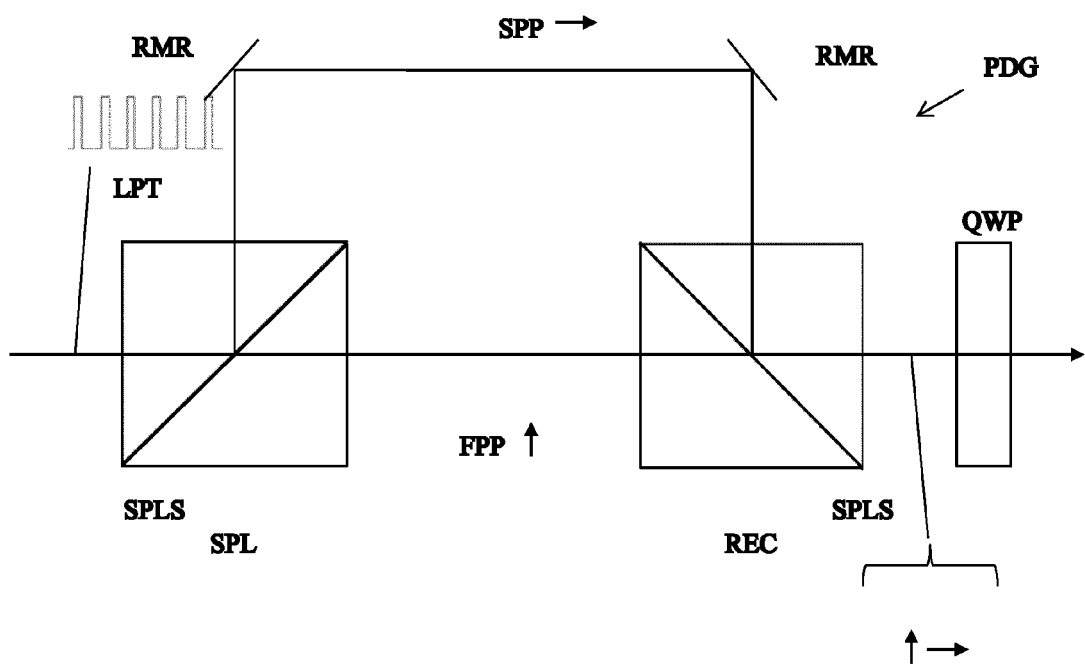
FIG. 3 depicts a schematic view of a pulse delay generator that may be comprised in an alignment sensor according to an embodiment of the invention.

As depicted in FIG. 3, in accordance with an aspect of the invention, a pulse delay generator PDG is provided. The pulse delay generator PDG may be comprised in the optical imaging system OIS introduced above in the description of FIG. 2. The pulse delay generator comprises a splitter SPL and a recombiner REC. The splitter is arranged in a propagation path of the pulse train, and splits the pulse train into pulse trains having different polarizations, i.e., a first polarized pulse train at a first polarization and a second polarized pulse train at a second polarization. The first polarization and the second polarisation differ from each other and may for example be orthogonal in respect of each other. The direction of the first polarization and the direction of the second polarization are schematically depicted in FIG. 3 by the vertical arrow and the horizontal arrow, respectively. The recombiner recombines the first polarized pulse train and the second polarized pulse train into a recombined pulse train. Both the splitter and the recombiner may be formed by a polarizing splitter. The first polarized pulse train propagates from the splitter to the recombiner along a first propagation path FPP. The second polarized pulse train travels from the splitter to the recombiner along a second propagation path SPP. In this schematic embodiment, the first propagation path extends in a same direction as the propagation path of the pulse train incident on the splitter. The splitter comprises a splitting surface SPLS, which is in this embodiment arranged at an angle of 45 degrees in respect of the propagation path of the pulse train when incident on the splitter. Consequently, the second propagation path extends from the splitter in a direction perpendicular to the first propagation path. In the embodiment as depicted, the pulse delay generator comprises dual reflecting mirrors RMR. A reflecting surface of a first one of the reflecting mirrors RMR is arranged parallel to the splitting surface of the splitter. A reflecting surface of the second one of the reflecting mirrors RMR is arranged parallel to a splitter surface SPLS of the recombiner. The reflecting mirrors are spaced apart from the splitter and recombiner in a direction perpendicular to the first propagation path. Consequently, a propagation path length of the first propagation path differs from a propagation length of the second propagation path. As a result, a propagation time along the first propagation path differs from the propagation time along the second propagation path. Thus, the recombined pulse train as recombined by the recombiner exhibits a first polarized pulse train and a second polarized pulse train one of which is delayed in respect of the other one. The difference in propagation path length, and consequently the difference in delay between the first propagation path and the second propagation path, may for example be set to half of a pulse cycle time of the pulse train as generated by the light source LLS. As a result, an effective pulse frequency (as incident on the alignment mark and as incident on the detector DET) doubles.

Generally, as a result of the differences in delay of the first polarized pulse train and the second polarized pulse train in respect of each other, the effective pulse frequency as incident on the alignment mark and as incident on the detector DET will be increased. As explained above, the non-linear optical element may introduce optical noise in the pulse train which, in known solutions, results in a noise contribution in the detector signal as detected by the detector, hence in the alignment measurement. The inventors have realized that the noise contributions in the different polarizations of the pulse train are uncorrected. As a result, an effective signal-to-noise ratio in the alignment measurement may be increased, as a total effective signal increases (e.g., doubles) as both the first and second polarizations are used, while the optical noise introduced by the non-linear optical element in the first and second polarized pulse trains may be uncorrected. Furthermore, the pulse frequency may effectively be increased, which may enable to perform a more accurate averaging of the detector signal by the detector (as the effective total number of pulses received by the detector during a detection of a scattered beam as scattered by the alignment mark, increases). Furthermore, as both polarizations are used, a total effective pulse intensity increases, resulting in a lower quantum photon shot noise limit, hence resulting in an improved alignment measurement reproducibility. Still further, in case of a diffraction grating being present in the alignment mark, diffraction grating asymmetry effects may be averaged to some extent as a result of the two orthogonal pulse trains incident on the diffraction grating. Still further, an application space of the alignment measurement may be increased. In case one of the polarization directions results in a low detector signal intensity (due to e.g., absorption in substrate layers covering the alignment mark) a detector signal intensity of the other one of the polarization directions may be reduced to a lesser extent, causing a detector signal intensity to be higher.

The difference in length between the first propagation path and the second propagation path may have any suitable value. In an embodiment, a difference between the propagation path length of the propagation path of the first polarized pulse train and the propagation path length of the propagation path of the second polarized pulse train shifts in time the first polarized pulse train and the second polarized pulse train in respect of each other by a relative delay between 10% and 50% of a pulse repetition time at the pulse repetition frequency. Thereby, the first and second pulse trains are spaced apart in time in respect of each other, which allows the detector to detect them one after the other.

In an embodiment, the pulse delay generator comprises a quarter wave plate QWP oriented at either + or −45 degrees with respect to the linear polarization and arranged downstream of the recombiner. The quarter wave plate transforms the orthogonal polarizations of the first and second polarized pulse trains into left- or right-handed circular polarization, respectively, or the reverse. In case the alignment mark includes a diffraction grating, it may happen that the diffraction grating only diffracts incident light of a specific polarization. With circular polarization, two orthogonal, linear polarizations are available. Furthermore, circular polarization is rotationally symmetric, as a result of which alignment marks with patterning along a first direction and other alignment marks with patterning along a second direction perpendicular to the first direction, scatter incident light similarly. Generally marks along one direction with some patterning not in this direction will diffract left- and right-circular polarizations differently.

Figure 4:
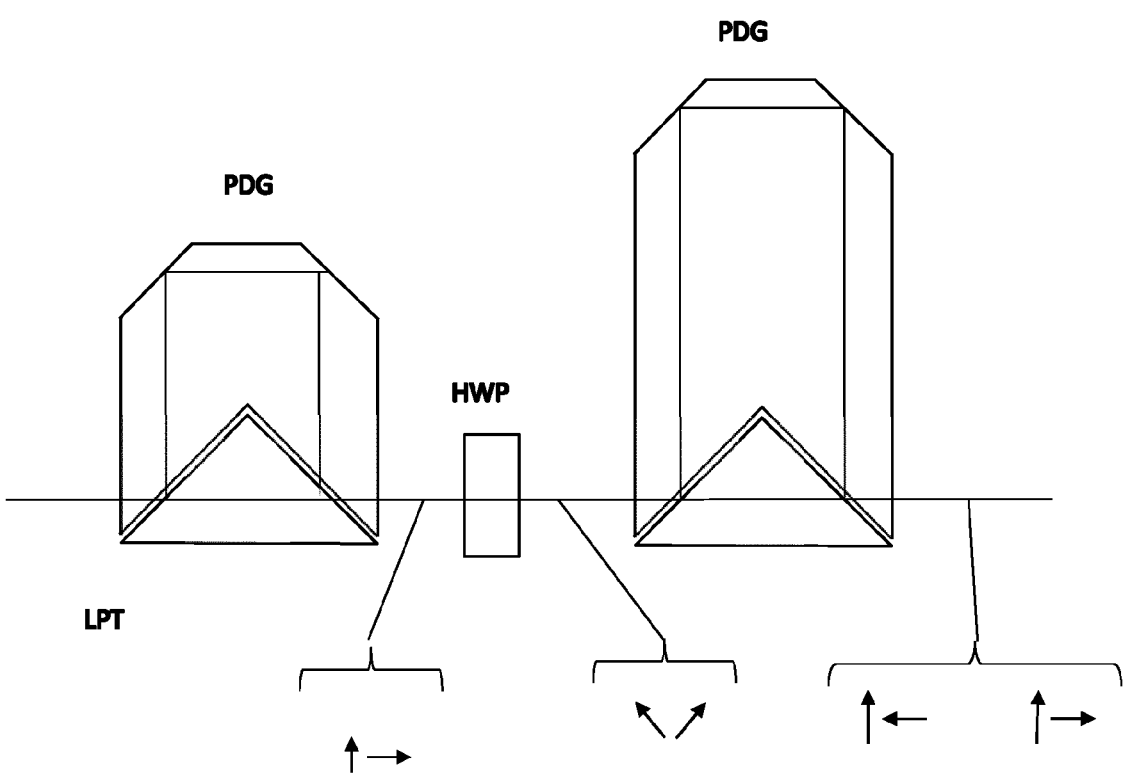
FIG. 4 depicts a schematic view of another embodiment of a pulse delay generator that may be comprised in an alignment sensor according to an embodiment of the invention

A further embodiment is depicted in FIG. 4. In this embodiment, a first pulse delay generator PDG and a second pulse delay generator PDG are cascaded. The first and second pulse delay generators may each be of a type and construction as described above. By means of the cascading of the pulse delay generators, a pulse repetition frequency of the pulse train may further be increased. Effectively four pulses may be projected onto the alignment mark for each pulse in the pulse train as generated by the light source. Generally, a difference in delay time of one of the delay generators is set to result in an effective delay in a range between 25% and 50% of the pulse repetition frequency of the pulse trains output by the light source. The difference in respective path lengths of the other one of the pulse delay generator and the further pulse delay generator is between 5% and 25% of the pulse repetition time at the pulse repetition frequency. Thereby, four pulses may result within each pulse repetition time, the pulses being detected one after the other, which may enable to further exploit the effects as described above in respect of the embodiment employing a single pulse delay generator as described with reference to FIG. 3. In order for the pulses to be spaced apart from each other, the difference in respective path lengths of one of the pulse delay generator and the further pulse delay generator may be set to substantially 50% of the pulse repetition time at the pulse repetition frequency, and the difference in respective path lengths of the other one of the pulse delay generator and the further pulse delay generator may be set to substantially 25% of the pulse repetition time at the pulse repetition frequency. It is also possible to have one pulse delay generator with a very short delay and another pulse delay generator, which has one of substantially 50% of the pulse repetition time, so as to generate 4 pulses. It is noted that the pulse delay generator having the largest delay and the one having the smallest delay may be cascaded in either order. As shown in FIG. 4, a half wave plate HWP is provided downstream of the first one of the pulse delay generators and upstream of the second one of the pulse delay generators. The half wave plate converts the orthogonal polarizations having first and second polarization directions (represented by the vertical and horizontal arrows) by 45 degrees. As a result, each of the pulses as incident on the second pulse delay generator contains a component in the first polarization direction as well as a component in the second polarization direction. As a result, the second one of the pulse delay generators again splits each pulse as resulting after the first pulse delay generator into two pulse, namely one in the first polarization direction and one in the second polarization direction.

It is noted that, where a delay is mentioned in terms of a reference to a pulse repetition time respectively a pulse repetition frequency, this may be understood so as to include delays exceeding one or a natural number of pulse repetition times by the stated amount. For example, a delay of 25% of a pulse repetition time is to be understood so as to also refer to a delay of 125%, 225%, 325% of the pulse repetition time.

Figure 5:
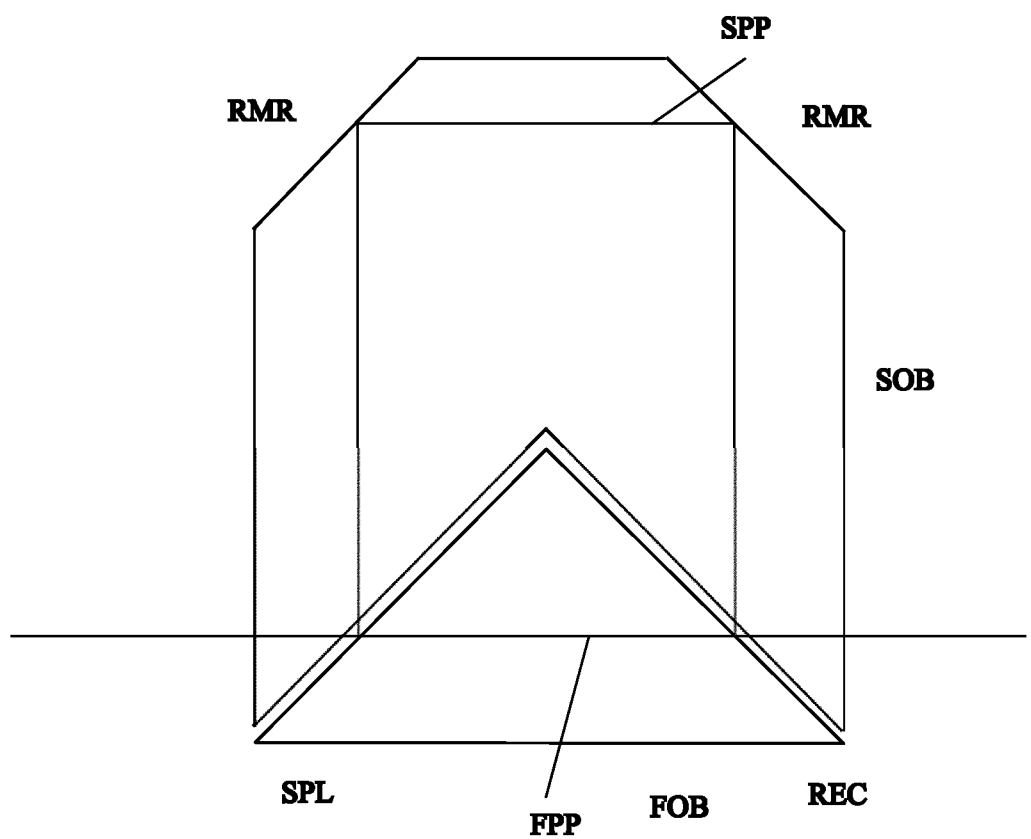
FIG. 5 depicts a schematic view of an implementation of the pulse delay generator in accordance with FIG. 3.

An embodiment of the delay generator is described with reference to FIG. 5. FIG. 5, likewise to FIG. 3, depicts the splitter SPL, recombiner REC, and reflecting mirrors RMR. A first optical block FOB comprises the splitter and recombiner. A splitter surface of the splitter SPL and a recombiner surface of the recombiner REC, respectively, are arranged at respective angles of 45 degrees in respect of the first propagation path FPP. Thereby, the splitter and recombiner are integrated into a single part. A second optical block SOB comprises the two reflective surfaces, which act as the reflecting mirrors RMR. The reflecting surfaces are arranged parallel to the splitter surface and to the recombiner surface, respectively, and are spaced apart from the splitter surface and the recombiner surface in a reflection direction on which one of the polarized pulse trains reflects from the splitter surface of the splitter, in this example in the direction perpendicular to the direction of the first propagation path FPP of the pulse train. The second propagation path is indicated with the label SPP. Thus, few parts are employed, and a delay time may be effectively set by the dimensioning of the first and second optical blocks. In an embodiment, the second optical block extends to the first optical block, thus leaving a narrow gap there between, which may allow that the delay times are largely set by the dimensioning of the optical blocks. Thereby, a shape of the second optical block, at a side facing the splitter and recombiner surfaces of the first optical block, complements a shape of the splitter and recombiner surfaces of the first optical block. The first and second optical block may be formed from any substantially transparent material, like glass, calcite, plastic, air, etc. Many other implementations of the delay generator are possible. For example, the splitter, recombiner and polarization dependent delay may be integrally provided in a fiber having a polarization dependent delay. In such embodiment, both (e.g., orthogonal) polarizations pass through the same fiber, while one of them is delayed more than the other one.

In an embodiment, the processing device comprises a low pass filter, which is configured to smoothen a pulse train of diffraction patterns as detected by the detector. The data processing device may be configured to:

integrate an output signal of the low pass filter,
compare the integrated low pass filter output signal with a stored calibration signal, and
derive the alignment data from the comparison. Thus, the detected, diffracted pulse train as detected by the detector, is low pass filtered so as to reduce the pulse repetition frequency component from the detector output signal. The resulting signal may be digitized by an analogue to digital converter. The digitized signal may be further integrated and compared with stored calibration data, such as a stored calibration curve which expresses position data of the grating as a function of the filtered, integrated, detector signal. The calibration data may also be formed by calibration data of various detectors, e.g., a detector that detects first order diffraction and a detector that detects minus first order diffraction. In such case, the calibration may be performed from a ratio of the integrated first and minus first order signals.

In an embodiment, the non-linear optical element is configured for converting the optical wavelength into a white light optical spectrum White light is a just a spectrum containing all wavelengths from, e.g., about 500 nanometer up to about 2.5 micrometer. The more colors there are, the more freedom a user has to select (or weigh) multiple colors. More available colors imply less impact on processing (stack parameters).

According to another aspect of the invention, there is provided a lithographic apparatus comprising an alignment sensor as described above. The lithographic apparatus may be of a type such as described with reference to FIG. 1A and/or FIG. 1B. The lithographic apparatus may comprise a substrate table to hold a substrate. The alignment sensor may be configured to determine a position of the substrate, which is held by the substrate table, so as to be able to measure a position of the substrate and to align the substrate.

What is claimed is:
1. An alignment sensor for a lithographic apparatus, the alignment sensor being arranged and constructed to measure an alignment of a movable part at the lithographic apparatus in respect of a stationary part of the lithographic apparatus, the alignment sensor comprising:
a light source configured to generate a pulse train at a optical wavelength and a pulse repetition frequency,
a non-linear optical element, arranged in an optical propagation path of the pulse train, the non-linear optical element being configured to transform the pulse train at the optical wavelength into a transformed pulse train in an optical wavelength range,
an optical imaging system configured to project the transformed pulse train onto an alignment mark;
a detector configured to detect a scattered field as scattered by the alignment mark, and
a data processing device configured to derive alignment data from the detected scattered field as detected by the detector,
wherein the optical imaging system comprises a pulse delay generator,
the pulse delay generator comprising:
a splitter configured to split the pulse train into a first polarized pulse train at a first polarization and a second polarized pulse train at a second polarization different from the first polarization,
a recombiner configured to combine the first polarized pulse train and the second polarized pulse train into a combined pulse train, wherein a propagation path length of a propagation path of the first polarized pulse train differs from a propagation path length of a propagation path of the second polarized pulse train so as to delay one of the first and second polarized pulse trains in respect of the other one of the polarized pulse trains, the optical imaging system being configured to project the combined pulse train onto an alignment mark.

2. The alignment sensor according to claim 1, wherein a difference between the propagation path length of the propagation path of the first polarized pulse train and the propagation path length of the propagation path of the second polarized pulse train delays the first polarized pulse train and the second polarized pulse train in respect of each other by a relative delay between 10% and 50% of a pulse repetition time at the pulse repetition frequency.

3. The alignment sensor according to claim 1, wherein the pulse delay generator further comprises a quarter wave plate, arranged downstream of the recombiner.

4. The alignment sensor according to claim 1, wherein the optical imaging system farther comprises a second pulse delay generator, arranged in an optical path of the optical imaging system, downstream of the pulse delay generator.

5. The alignment sensor according to claim 4, wherein the pulse delay generator further comprises a half wave plate, arranged downstream of the recombiner of the pulse delay generator, and the second pulse delay generator further comprises a quarter wave plate, arranged downstream of the recombiner of the second pulse delay generator.

6. The alignment sensor according to claim 4, wherein the difference in respective path lengths of one of the pulse delay generators and the further pulse delay generator is between 25% and 50% of the pulse repetition time at the pulse repetition frequency, and the difference in respective path lengths of the other one of the pulse delay generators and the further pulse delay generator is between 5% and 25% of the pulse repetition time at the pulse repetition frequency.

7. The alignment sensor according to claim 1, wherein the delay generator is formed by a first optical block comprising a splitter surface and a recombiner surface forming part of the splitter and the recombiner respectively, the splitter surface and the recombiner surface being arranged at an angle of 45 degrees in respect of the propagation path, and a second optical block having two reflective surfaces that are arranged substantially parallel to the splitter surface and the recombiner surface respectively and spaced apart from the splitter surface and the recombiner surface in a reflection direction on which one of the polarized pulse trains reflects from the splitter surface of the splitter.

8. The alignment sensor according to claim 7, wherein the second optical block extends to the first optical block.

9. The alignment sensor according claim 1, wherein the processing device comprises a low pass filter which is configured to smooth a pulse train of scattered fields as detected by the detector, and wherein the data processing device is configured to integrate an output signal of the low pass filter, compare the integrated low pass filter and output signal with a stored calibration signal, and derive the alignment data from the comparison.

10. The alignment sensor according to claim 1, wherein the non-linear optical element is configured to convert the optical wavelength in a white light optical spectrum.

11. A lithographic apparatus comprising an alignment sensor comprising:
a light source configured to generate a pulse train at an optical wavelength and a pulse repetition frequency,
a non-linear optical element, arranged in an optical propagation path of the pulse train, the non-linear optical element being configured to transform the pulse train at the optical wavelength into a transformed pulse train in an optical wavelength range,
an optical imaging system configured to project the transformed pulse train onto an alignment mark;
a detector to detect a scattered field as scattered by the alignment mark, and
a data processing device configured to derive alignment data from the detected scattered field as detected by the detector,
wherein the optical imaging system comprises a pulse delay generator,
the pulse delay generator comprising:
a splitter configured to split the pulse train into a first polarized pulse train at a first polarization and a second polarized pulse train at a second polarization different from the first polarization,
a recombiner configured to combine the first polarized pulse train and the second polarized pulse train into a combined pulse train,
wherein a propagation path length of a propagation path of the first polarized pulse train differs from a propagation path length of a propagation path of the second polarized pulse train so as to delay one of the first and second polarized pulse trains in respect of the other one of the polarized pulse trains,
the optical imaging system being configured to project the combined pulse train onto an alignment mark.

12. The lithographic apparatus according to claim 11, comprising a substrate table to hold a substrate, wherein the alignment sensor is configured to determine a position of a substrate held by the substrate table via the alignment mark at the substrate.

* * * * *